(12) United States Patent
Mehta et al.

(10) Patent No.: US 7,518,378 B2
(45) Date of Patent: Apr. 14, 2009

(54) CABLE COMPENSATION FOR PULSED I-V MEASUREMENTS

(75) Inventors: Rajat Mehta, Twinsburg, OH (US); Pete Hulbert, Cleveland, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 306 days.

(21) Appl. No.: 11/705,858

(22) Filed: Feb. 13, 2007

(65) Prior Publication Data

US 2008/0191709 A1 Aug. 14, 2008

(51) Int. Cl.
*G01R 35/00* (2006.01)
*G01R 27/08* (2006.01)
*G01D 18/00* (2006.01)

(52) U.S. Cl. .............. 324/601; 324/638; 324/713; 702/85

(58) Field of Classification Search ............. 324/601; 702/85

See application file for complete search history.

(56) References Cited

U.S. PATENT DOCUMENTS

| 7,068,049 | B2 * | 6/2006 | Adamian | 324/638 |
| 7,071,707 | B2 * | 7/2006 | Tiemeijer | 324/638 |
| 7,348,784 | B2 * | 3/2008 | Karuta et al. | 324/601 |
| 2006/0145708 | A1 * | 7/2006 | Saito | 324/713 |
| 2007/0029990 | A1 * | 2/2007 | Kamitani | 324/76.22 |

OTHER PUBLICATIONS

Efficient Microwave Bias and Testing Using the HP 4142B Modular DC Source/Monitor. Hewlett Packard. Application Note 1205 (Date: At least as early as Aug. 30, 2006).

* cited by examiner

*Primary Examiner*—Timothy J Dole
*Assistant Examiner*—John Zhu
(74) *Attorney, Agent, or Firm*—Pearne & Gordon LLP

(57) ABSTRACT

The errors related to the resistance of test conductors and sense/load resistances for a pulse I-V measurement system are determined by making open circuit and through circuit measurements using a combination of DC and pulse instrument measurements.

8 Claims, 2 Drawing Sheets

US 7,518,378 B2

CABLE COMPENSATION FOR PULSED I-V MEASUREMENTS

BACKGROUND OF THE INVENTION

The present invention relates to pulsed measurements and, in particular, to the measurement of I-V characteristics for semiconductor devices.

It is well-known to characterize semiconductor devices according to their I-V curves and similar measurements. Historically, such measurements are made with DC signals applied and measured. However, these DC measurements are not always suitable. For example, in many cases, these DC measurements result in significant heating of the devices resulting in measurements with little value.

SUMMARY OF THE INVENTION

A method for calibrating a pulse I-V measurement system for testing a DUT having at least two terminals is disclosed. The system has a first pulse measurement device connectable to an instrument end of a first test conductor; a pulse generator connectable to an instrument end of a second test conductor, the test conductors each having a DUT end connectable to respective DUT terminals; and a second pulse measurement device, one of the pulse generator and the second pulse measurement device being adapted to float on the potential of the other. The method includes shorting the DUT ends of the test conductors together; connecting the pulse generator to the second test conductor; sourcing a first voltage through the test conductors and the load resistance of the first pulse measurement device with the pulse generator; measuring a second voltage across the first pulse measurement device load resistance with the first pulse measurement device; determining the current through the sense resistance of the second pulse measurement device based on the second voltage and the first pulse measurement device load resistance; measuring a third voltage across the sense resistance with the second pulse measurement device; determining the resistance $R_S$ of the sense resistance based on the current through the sense resistance and the third voltage; and using $R_S$ to correct measurements made on the DUT.

DESCRIPTION OF THE PREFERRED EMBODIMENTS

Figure 1:
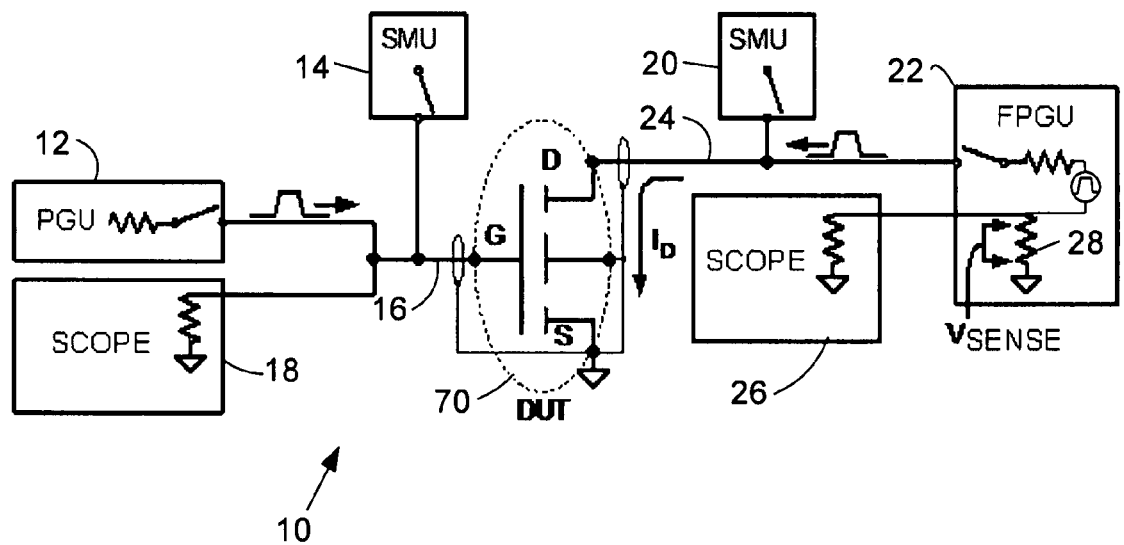
FIG. 1 is a schematic diagram of an example pulsed I-V measurement system with a floating pulse generator.

Referring to FIG. 1, a pulsed I-V measurement system 10 includes a pulse generator 12 and a source measure unit SMU 14 that are switchably connectable via a cable 16 to a DUT 70. A pulse measurement device 18 is also connected to the cable 16. Another SMU 20 and another pulse generator 22 are switchably connectable via a cable 24 to the DUT 70. The pulse generator 22 floats on another pulse measurement device 26.

The pulse generators 12, 22 provide pulses with desired characteristics including, for example, amplitude, duration, and repetition rate. This includes, for example, the ability to-source DC voltage levels.

SMUs can source a DC voltage and measure a DC current, or vice versa. They are readily available as integral units or they may be implemented with separate voltage/current sources and current/voltage meters. The SMUs 14, 20 allow conventional DC measurements to be made with the same system in addition to pulsed measurements.

The pulse measurement devices 18, 26 measure pulse waveforms. This includes, for example measuring DC voltage levels. The devices may be, for example, oscilloscopes or high speed digitizers.

The cables 16, 24 have a DUT end and an instrument end. They may be, for example, coaxial cables, twin leads, spaced circuit board traces, or other test conductors suitable for pulsed and DC measurements.

The pulse generator 22 floats on the input of the pulse measurement device 26. This means that the pulse generator 22 is not affected by common mode voltages. One result of this is that all current supplied by the pulse generator 22 is proportional to the voltage drop across the sense resistance 28, shown by way of example, within the pulse generator 22. This resistance could also be located, for example, within the pulse measurement device 26 or external to both. In the example shown, it is in parallel with a load resistance within the pulse measurement device 26.

In high precision DC measurements, it is common to use techniques such as Kelvin measurements to remove the effects of potential error sources such as test conductor resistance. In the pulse regime, such techniques are not practical.

The present invention provides a method for removing undesired errors from the system 10.

Figure 2:
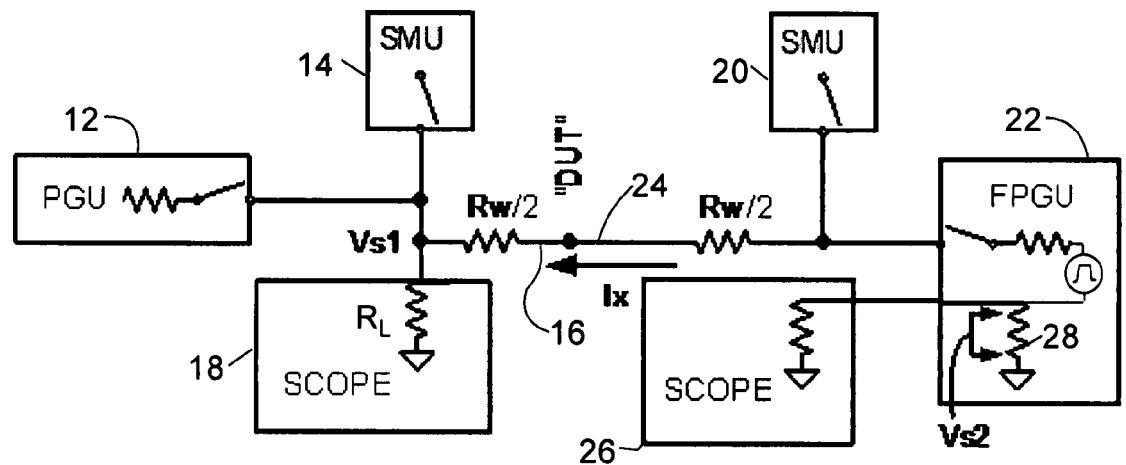
FIG. 2 is a portion of the schematic diagram of FIG. 1 simplified to aid in the understanding of the invention.

Referring to FIG. 2, one source of error is uncertainty in the value $R_S$ of the sense resistance 28.

To measure $R_S$, the DUT ends of the cables 16, 24 are shorted to each other (commonly, a device called a "through" is substituted for the DUT). The pulse generator 22 is connected to the instrument end of the cable 24. The pulse generator 22 sources a voltage through the cables 16, 24 and the load resistance $R_L$ of the pulse measurement device 18. $R_L$ may be a known value, or measured as set forth below. The pulse measurement device 18 measures a voltage $V_{S1}$ across $R_L$.

The current $I_X$ through the circuit is then $V_{S1}/R_L$. Typically, the value of the load resistance in the pulse measurement device 26 is such that, effectively, all of the current $I_X$ in the circuit passes through the sense resistance 28.

The pulse measurement device 26 measures a voltage $V_{S2}$ across the sense resistance 28. The resistance $R_S$ is then $V_{S2}/I_X$.

Referring again to FIG. 2, another source of error is the resistance of the cables 16, 24. If the cables are identical, it can be assumed that the total resistance of the cables $R_W$ is proportional to the sum of the total length of the cable. If the cables are of equal length, then the resistance of each is one-half $R_W$. $R_W$ can be determined before or after $R_S$. The following example first finds $R_W$ and then $R_S$.

The DUT ends of the cables 16, 24 are shorted to each other. The SMU 14 is connected to the instrument end of the cable 16 and the SMU 20 is connected to the instrument end of the cable 24. The SMU 16 sources a voltage $V_1$ on the cable 16. The SMU 20 sources a voltage $V_2$ the cable 24. If, for example, the voltage $V_2$ is 0 v (it should be noted that this is a virtual ground forced by the SMU not an actual ground), then the SMU 14 itself can then measure the current $I_D$ through the cables 16, 24, otherwise the difference in the currents measured by each SMU is the measured current. The resistance $R_W$ is then the difference $V_1-V_2$ divided by the measured current $I_D$.

Continuing to determine $R_S$:

The SMUs 14, 20 are disconnected. The pulse generator 22 is connected to the instrument end of the cable 24. The pulse generator 22 sources a voltage through the cables 16, 24 and the load resistance $R_L$ of the pulse measurement device 18. The pulse measurement device 18 measures a voltage $V_{S1}$ across $R_L$. The current $I_X$ through the circuit is then $V_{S1}/R_L$. The pulse measurement device 26 measures a voltage $V_{S2}$ across the sense resistance 28. The resistance $R_S$ is then $V_{S2}/I_X$.

Figure 3:
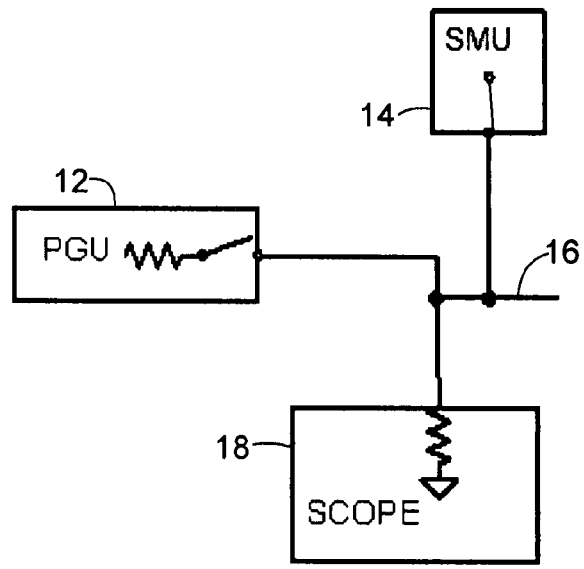
FIG. 3 is another portion of the schematic diagram of FIG. 1 simplified to aid in the understanding of the invention.

Referring to FIG. 3, the measurement of $R_S$ can be further improved by actually measuring the value $R_L$ in the circuit.

In general, it would be desirable to perform this measurement before those described above.

If not already the case, open the DUT ends of the cables 16, 24. Connect the SMU 14 to the instrument end of the cable 16. The SMU 14 sources a voltage $V_4$ through $R_L$. The SMU 14 measures the current $I_4$ through $R_L$. The value of $R_L$ is then $V_4/I_4$.

The measured values of $R_L$, $R_W$ and $R_S$ can each be used, for example, to correct measurements made on the DUT by either negating undesired voltage drops or more accurately determining currents based on better knowledge of sense resistance.

It should be understood that, typically, the operation of the system 10 and the performance of the method of the invention will be under the control of a computer or a similar control device.

Figure 4:
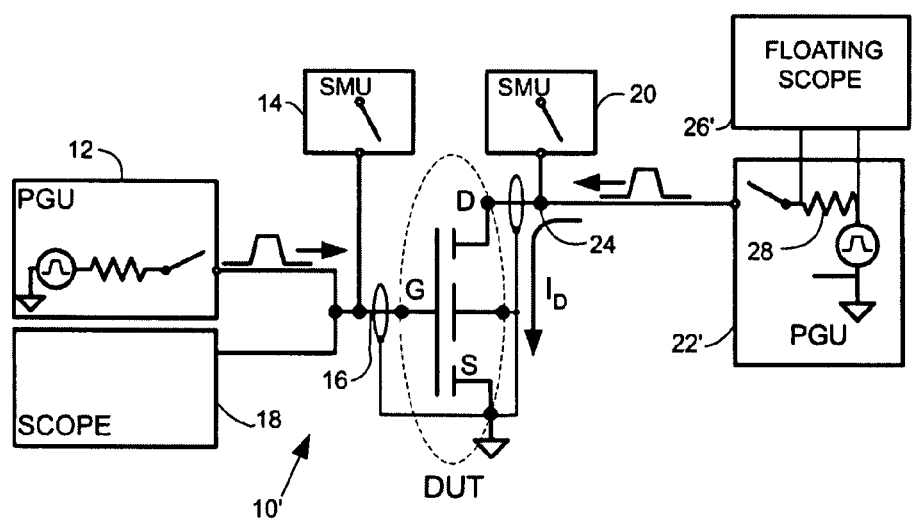
FIG. 4 is a schematic diagram of an example pulsed I-V measurement system with a floating pulse measurement device.

Referring to FIG. 4, a pulsed I-V measurement system 10' includes a pulse generator 12 and a source measure unit SMU 14 that are switchably connectable via a cable 16 to a DUT 70. A pulse measurement device 18 is also connected to the cable 16. Another SMU 20 and another pulse generator 22' are switchably connectable via a cable 24 to the DUT 70. Unlike the system 10, a pulse measurement device 26' floats on the pulse generator 22', instead of vice versa.

This means that the pulse measurement device 26' is not affected by common mode voltages. One result of this is that all current supplied by the pulse generator 22' is proportional to the voltage drop across the sense resistance 28, shown by way of example, within the pulse generator 22'. This resistance could also be located, for example, within the pulse measurement device 26' or external to both.

The operation of the system 10' is essentially the same as the system 10 as described above and the method of removing errors is also essentially the same.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for calibrating a pulse I-V measurement system for testing a DUT having at least two terminals, said system having a first pulse measurement device connectable to an instrument end of a first test conductor; a pulse generator connectable to an instrument end of a second test conductor, said test conductors each having a DUT end connectable to respective DUT terminals; and a second pulse measurement device, said pulse generator being adapted to float on the potential of said second pulse measurement device, said method comprising:

shorting the DUT ends of said test conductors together;

connecting said pulse generator to said second test conductor;

sourcing a first voltage through said test conductors and the load resistance of said first pulse measurement device with said pulse generator;

measuring a second voltage across said first pulse measurement device load resistance with said first pulse measurement device;

determining the current through the sense resistance of said second pulse measurement device based on said second voltage and said first pulse measurement device load resistance;

measuring a third voltage across said sense resistance with said second pulse measurement device;

determining the resistance $R_S$ of said sense resistance based on the current through said sense resistance and the third voltage; and using $R_S$ to correct measurements made on said DUT.

2. A method according to claim 1, further comprising:

opening the DUT ends of said test conductors;

connecting a SMU to said first test conductor;

sourcing a fourth voltage through said first pulse measurement device load resistance with said SMU;

measuring the current through said first pulse measurement device load resistance with said SMU;

determining the resistance $R_L$ of said first pulse measurement device load resistance based on said fourth voltage and said current measured through said first pulse measurement device load resistance; and using $R_L$ in determining $R_S$ and in correcting measurements made on said DUT.

3. A method for calibrating a pulse I-V measurement system for testing a DUT having at least two terminals, said system having a first SMU and a first pulse measurement device, each connectable to an instrument end of a first test conductor; a second SMU and a pulse generator, each connectable to an instrument end of a second test conductor, said test conductors each having a DUT end connectable to respective DUT terminals; and a second pulse measurement device, said pulse generator being adapted to float on the potential of said second pulse measurement device, said method comprising:

shorting the DUT ends of said test conductors together;

connecting said SMUs to respective test conductors;

sourcing a first voltage on said first test conductor with said first SMU;

sourcing a second voltage on said second test conductor with said second SMU;

measuring the current through said conductors with at least one of said SMUs;

determining the resistance $R_W$ of said conductors based on the difference between said first voltage and said second voltage and said measured current;

disconnecting said SMUs;

connecting said pulse generator to said second test conductor;

sourcing a third voltage through said test conductors and the load resistance of said first pulse measurement device with said pulse generator;

measuring a fourth voltage across said first pulse measurement device load resistance with said first pulse measurement device;

determining the current through the sense resistance of said second pulse measurement device based on said fourth voltage and said first pulse measurement device load resistance;

measuring the voltage across said sense resistance with said second pulse measurement device;

determining the resistance $R_S$ of said sense resistance based on the current through said sense resistance and the voltage across said sense resistance; and using $R_W$ and $R_S$ to correct measurements made on said DUT.

4. A method according to claim 3, further comprising:

opening the DUT ends of said test conductors;

connecting said first SMU to said first test conductor;

sourcing a fifth voltage through said first pulse measurement device load resistance with said first SMU;

measuring the current through said first pulse measurement device load resistance with said first SMU;

determining the resistance $R_L$ of said first pulse measurement device load resistance based on said fifth voltage and said current measured through said first pulse measurement device load resistance; and using $R_L$ in determining $R_S$ and in correcting measurements made on said DUT.

5. A method for calibrating a pulse I-V measurement system for testing a DUT having at least two terminals, said system having a first pulse measurement device connectable to an instrument end of a first test conductor; a pulse generator connectable to an instrument end of a second test conductor, said test conductors each having a DUT end connectable to respective DUT terminals; and a second pulse measurement device, said second pulse measurement device being adapted to float on the potential of said pulse generator, said method comprising:

shorting the DUT ends of said test conductors together;

connecting said pulse generator to said second test conductor;

sourcing a first voltage through said test conductors and the load resistance of said first pulse measurement device with said pulse generator;

measuring a second voltage across said first pulse measurement device load resistance with said first pulse measurement device;

determining the current through the sense resistance of said second pulse measurement device based on said second voltage and said first pulse measurement device load resistance;

measuring a third voltage across said sense resistance with said second pulse measurement device;

determining the resistance $R_S$ of said sense resistance based on the current through said sense resistance and the third voltage; and using $R_S$ to correct measurements made on said DUT.

6. A method according to claim 5, further comprising:

opening the DUT ends of said test conductors;

connecting a SMU to said first test conductor;

sourcing a fourth voltage through said first pulse measurement device load resistance with said SMU;

measuring the current through said first pulse measurement device load resistance with said SMU;

determining the resistance $R_L$ of said first pulse measurement device load resistance based on said fourth voltage and said current measured through said first pulse measurement device load resistance; and using $R_L$ in determining $R_S$ and in correcting measurements made on said DUT.

7. A method for calibrating a pulse I-V measurement system for testing a DUT having at least two terminals, said system having a first SMU and a first pulse measurement device, each connectable to an instrument end of a first test conductor; a second SMU and a pulse generator, each connectable to an instrument end of a second test conductor, said test conductors each having a DUT end connectable to respective DUT terminals; and a second pulse measurement device, said second pulse measurement device being adapted to float on the potential of said pulse generator device, said method comprising:

shorting the DUT ends of said test conductors together;

connecting said SMUs to respective test conductors;

sourcing a first voltage on said first test conductor with said first SMU;

sourcing a second voltage on said second test conductor with said second SMU;

measuring the current through said conductors with at least one of said SMUs;

determining the resistance $R_W$ of said conductors based on the difference between said first voltage and said second voltage and said measured current;

disconnecting said SMUs;

connecting said pulse generator to said second test conductor;

sourcing a third voltage through said test conductors and the load resistance of said first pulse measurement device with said pulse generator;

measuring a fourth voltage across said first pulse measurement device load resistance with said first pulse measurement device;

determining the current through the sense resistance of said second pulse measurement device based on said fourth voltage and said first pulse measurement device load resistance;

measuring the voltage across said sense resistance with said second pulse measurement device;

determining the resistance $R_S$ of said sense resistance based on the current through said sense resistance and the voltage across said sense resistance; and using $R_W$ and $R_S$ to correct measurements made on said DUT.

8. A method according to claim 7, further comprising:

opening the DUT ends of said test conductors;

connecting said first SMU to said first test conductor;

sourcing a fifth voltage through said first pulse measurement device load resistance with said first SMU;

measuring the current through said first pulse measurement device load resistance with said first SMU;

determining the resistance $R_L$ of said first pulse measurement device load resistance based on said fifth voltage and said current measured through said first pulse measurement device load resistance; and using $R_L$ in determining $R_S$ and in correcting measurements made on said DUT.

* * * * *